(12) United States Patent
Suzuki et al.

(10) Patent No.: US 8,518,863 B2
(45) Date of Patent: Aug. 27, 2013

(54) SLIDING MEMBER

(75) Inventors: Masahiro Suzuki, Kashiba (JP);
Kazuyoshi Yamakawa, Nishinomiya (JP); Toshiyuki Saito, Kashiba (JP); Junji Ando, Kashiba (JP); Tomoo Suzuki, Chita-gun (JP); Hiroyuki Hashitomi, Kariya (JP); Daigo Yamamoto, Kariya (JP)

(73) Assignees: JTEKT Corporation, Osaka-shi (JP); CNK Co., Ltd., Kariya-shi (JP)

( * ) Notice: Subject to any disclaimer, the term of this patent is extended or adjusted under 35 U.S.C. 154(b) by 496 days.

(21) Appl. No.: 12/707,308

(22) Filed: Feb. 17, 2010

(65) Prior Publication Data

US 2010/0210488 A1     Aug. 19, 2010

(30) Foreign Application Priority Data

Feb. 17, 2009   (JP) ................................. 2009-034575

(51) Int. Cl.
*C10M 103/02*    (2006.01)
(52) U.S. Cl.
USPC ......................................... 508/109; 508/107
(58) Field of Classification Search
USPC ................................................ 508/107, 109
See application file for complete search history.

(56) References Cited

U.S. PATENT DOCUMENTS

2006/0286292 A1* 12/2006 Jiang et al. ..................... 427/127
2010/0130291 A1* 5/2010 Ando et al. .................... 464/162

FOREIGN PATENT DOCUMENTS

| | | |
|---|---|---|
| JP | 2002-235748 | 8/2002 |
| JP | 2004-169137 | 6/2004 |
| JP | 2004169137 A * | 6/2004 |
| JP | 2005163835 A * | 6/2005 |
| JP | 2006-22882 | 1/2006 |
| JP | 2006-161075 | 6/2006 |
| JP | 2006-291355 | 10/2006 |
| JP | 2007-177955 | 7/2007 |
| JP | 2007-270275 | 10/2007 |
| JP | 2007-284760 | 11/2007 |
| WO | WO 2007043637 A1 * | 4/2007 |

OTHER PUBLICATIONS

DLC Film Coating Technique for Higher Functionality, The Advanced Materials Processing Institute Kinki Japan (Dry Coating Study Group ed) 1st edition, Nikkan Kogyo Shimbun Ltd., Sep. 28, 2007, pp. 126-138.
Nobuyuki Terayama, DLC Peripheral Coating and Internal Coating by Plasma CVD Method, Proceedings of the 8th Symposium on "Current Status and Future of Tribo Coating", 50-year Progress on Automobile Engine Bearings, Tribo-Coating Forum and Riken, Advanced Development and Supporting Center, Mar. 3, 2006, pp. 29-35.
Office Action issued Apr. 5, 2013, in Japanese Application No. 2009-34575 filed Feb. 17, 2009 (With English Translation).
Office Action issued May 30, 2013, in Japanese Application No. 2013-8788 (with English Translation).

* cited by examiner

*Primary Examiner* — Taiwo Oladapo
(74) *Attorney, Agent, or Firm* — Oblon, Spivak, McClelland, Maier & Neustadt, L.L.P.

(57) ABSTRACT

A sliding member has a base material whose surface is at least partially covered with a DLC film, wherein an intermediate layer is interposed between the base material and the DLC film, and the intermediate layer has a multilayer structure obtained by stacking a first Cr layer, a CrN layer and a second Cr layer successively from the side closer to the base material.

20 Claims, 4 Drawing Sheets

(a)

(b)

to each other in the axial direction. A spline portion 4 is formed on an end portion of the first shaft 2 closer to the second shaft 3, while another spline portion 5 is formed on an end portion of the second shaft 3 closer to the first shaft 2. The spline portions 4 and 5 slidably engage with each other, whereby the first shaft 2 and the second shaft 3 are coupled with each other.

SLIDING MEMBER

BACKGROUND OF THE INVENTION

1. Field of the Invention

The present invention relates to a sliding member. The sliding member includes a member such as a spline portion of a propeller shaft (a drive shaft), a cage or a raceway surface of an inner or outer ring of a bearing, or a clutch plate of a friction clutch, for example.

2. Description of Related Art

A vehicle is loaded with a propeller shaft (a drive shaft) for transmitting driving power from the engine to a differential gear. The propeller shaft is formed by coupling two shafts with each other to be expandable/contractible in the axial direction. More specifically, an external spline portion consisting of a plurality of keys along the axial direction and an internal spline portion consisting of a plurality of keyways are formed on the coupled portions of the shafts respectively. The spline portions slidably engage with each other, so that rotational driving force of one of the shafts is transmitted to the other shaft and the overall propeller shaft can be expanded/contracted. The spline portions are filled with a lubricant such as grease. If the lubricant runs out, a stick slip (hang-up) may be caused in sliding of the spline portions, to result in noise.

A structure of covering the spline portion of each shaft with a DLC (Diamond Like Carbon) film having wear resistance (high hardness) and low frictional properties so that occurrence of such noise can be suppressed even if the lubricant runs up is known (Japanese Unexamined Patent Publication No. 2006-22882, for example).

However, the DLC film has extremely high internal stress. If the DLC film is directly formed on the surface of a base material, therefore, the DLC film may be easily separated or cracked due to low adhesiveness of the DLC film with respect to the base material (particularly a metal substrate).

Therefore, a technique of interposing an intermediate layer such as a Ti (Titanium) layer between the base material and the DLC film thereby improving the adhesiveness of the DLC film with respect to the base material and increasing the life thereof is known in general (Japanese Unexamined Patent Publication No. 2002-235748, for example).

However, the intermediate layer is constituted of a single film, and hence the adhesiveness of the DLC film with respect to the base material is insufficient. Therefore, awaited is a means for further improving the adhesiveness of the DLC film with respect to the base material by providing the intermediate layer in a multilayer structure.

SUMMARY OF THE INVENTION

Accordingly, an object of the present invention is to provide a sliding member capable of increasing the life thereof by further improving adhesiveness of a DLC film to a base material.

The present invention provides a sliding member having a base material whose surface is at least partially covered with a DLC (Diamond Like Carbon) film, wherein an intermediate layer is interposed between the base material and the DLC film, and the intermediate layer has a multilayer structure obtained by stacking a first Cr (chromium) layer, a CrN (chromium nitride) layer and a second Cr layer successively from the side closer to the base material.

According to the structure, the intermediate layer has the multilayer structure obtained by stacking the first Cr layer, the CrN layer and the second Cr layer successively from the side closer to the base material. The first Cr layer having strong bonding force to the base material and the CrN layer is interposed between the base material and the CrN layer, whereby the CrN layer exhibits excellent adhesiveness to the base material. Further, the second Cr layer having strong bonding force to the CrN layer and the DLC film is interposed between the CrN layer and the DLC film, whereby the DLC film exhibits excellent adhesiveness to the CrN layer. Therefore, the DLC film has excellent adhesiveness with respect to the base material. Thus, the life of the sliding member can be increased.

The intermediate layer includes the CrN layer having high hardness (high wear resistance), and is hence hardly deformed. Therefore, the DLC film is also hardly deformed, and the surface (a sliding surface) of the DLC film sliding with a counter member can be kept planar. Therefore, frictional properties (low frictional properties) of the DLC film are further improved.

Carbon steel (S30C or S45C), for example, may be employed as the material for the base material.

Preferably, Si (silicon) is added to the DLC film in the ratio of 0 to 50 wt. %. According to the structure, Si is added to the DLC film in the ratio of 0 to 50 wt. %. Therefore, Si contained in the DLC film relaxes the internal stress, and the DLC film has superior frictional properties (low frictional properties) due to a lubricating effect specific to Si. If the content of Si exceeds 50 wt. %, however, a film smooth and excellent in lubricity cannot be formed.

The DLC film may have a multilayer structure obtained by stacking Si slope layers.

Further, the sliding member may be a spline portion of a propeller shaft.

The foregoing and other objects, features and effects of the present invention will become more apparent from the following detailed description of the embodiments with reference to the attached drawings.

DETAILED DESCRIPTION OF PREFERRED EMBODIMENTS

Figure 1:
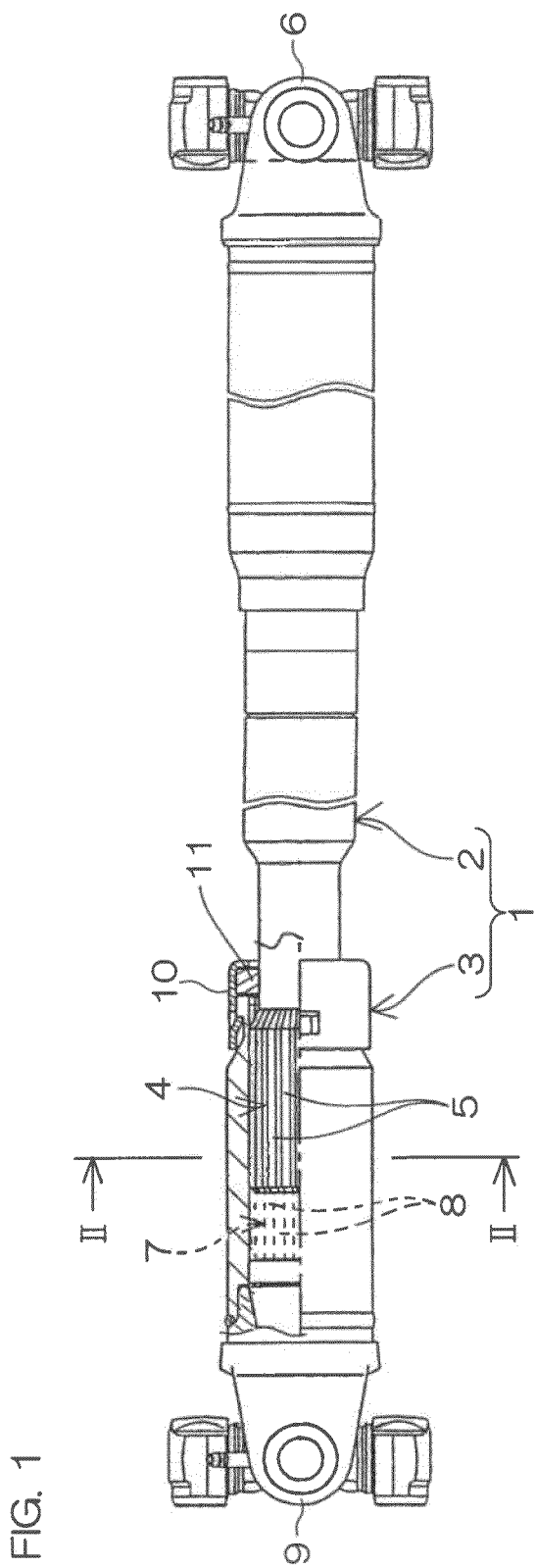
FIG. 1 is a front elevational view showing a schematic structure of a propeller shaft including a first shaft as a sliding member according to an embodiment of the present invention.
Figure 2:
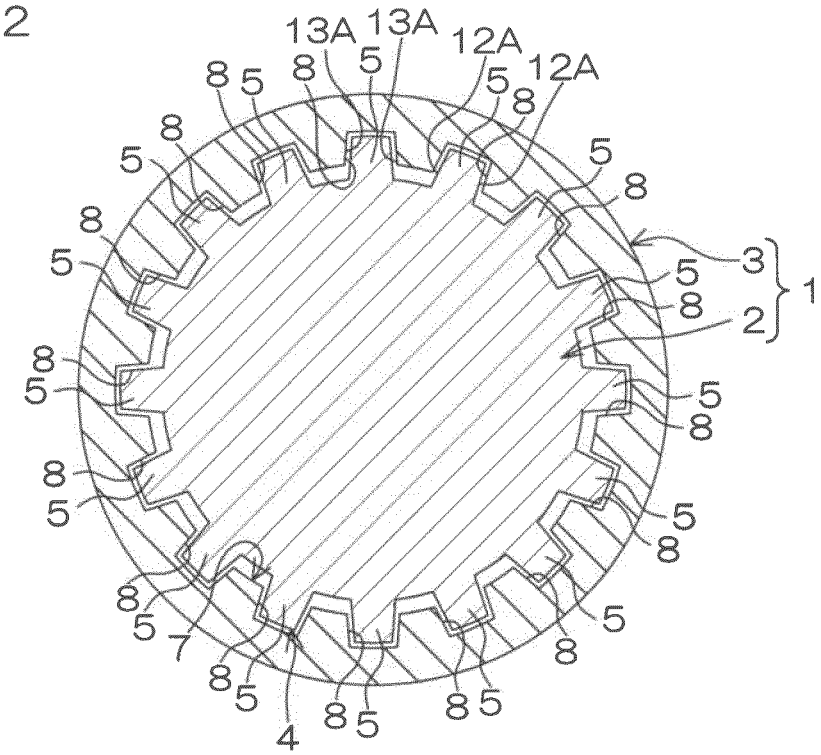
FIG. 2 is a sectional view taken along a line II-II in FIG. 1.

FIG. 1 is a front elevational view showing a schematic structure of a propeller shaft 1 including a first shaft 2 as a sliding member according to an embodiment of the present invention. FIG. 1 shows the propeller shaft 1 in a partially fragmented manner. FIG. 2 is a sectional view taken along a line II-II in FIG. 1.

The propeller shaft (a drive shaft) 1 includes the first shaft 2 and a second shaft 3 coupled to the first shaft 2 to be slidable in the axial direction. The first shaft 2 and the second shaft 3 are made of carbon steel (S30C or S45C) respectively. The propeller shaft 1 can be expanded/contracted by axially sliding the second shaft 3 with respect to the first shaft 2.

An external spline portion 4 is formed on an end portion (the end portion closer to the second shaft 3) of the first shaft 2. The external spline portion 4 includes a large number of keys 5 extending along the axial direction. The keys 5 are provided over the entire periphery of the first shaft 2 at regular intervals in the peripheral direction. A first universal joint 6 for coupling the propeller shaft 1 to either a driving input shaft (not shown) or a driving output shaft (not shown) is connected to the other end portion (the end portion opposite to the second shaft 3) of the first shaft 2.

The second shaft 3 is cylindrical, and externally fitted with the first shaft 2. An internal spline portion 7 is formed on the inner periphery of an end portion (the end portion closer to the first shaft 2) of the second shaft 3. The internal spline portion 7 is provided with a large number of keyways 8 extending along the axial direction. The keyways 8 are provided over the entire periphery of the second shaft 3 at regular intervals in the peripheral direction. The large number of keyways 8 mesh with the large number of keys 5 respectively. In other words, the external spline portion 4 of the first shaft 2 engages with the internal spline portion 7 of the second shaft 3. Thus, rotational driving force can be transmitted between the first shaft 2 and the second shaft 3. The external spline portion 4 of the first shaft 2 and the internal spline portion 7 of the second shaft 3 slide with each other. A second universal joint 9 for coupling the propeller shaft 1 to either the driving output shaft (not shown) or the driving input shaft (not shown) is connected to the other end portion (the end portion opposite to the first shaft 2) of the second shaft 3.

A prescribed clearance is set between the external spline portion 4 of the first shaft 2 and the internal spline portion 7 of the second shaft 3, and grease as a lubricant is sealed into a gap formed by the clearance between the external spline portion 4 and the internal spline portion 7. At least one of an antioxidant, an anticorrosive agent, a corrosion inhibiter and a load carrying additive is added to the grease as an additive.

An annular sealing member 11 is mounted on the end portion (the end portion closer to the first shaft 2) of the second shaft 3 through a generally cylindrical fixing member 10. The sealing member 11 is prepared from a rubber material or a resin material, and seals the space between the first and second shafts 2 and 3 by coming into contact with the outer peripheral surface of the first shaft 2 inserted into the second shaft 3. The sealing member 11 inhibits the grease sealed into the gap between the external spline portion 4 and the internal spline portion 7 from outward leakage. Further, the sealing member 11 prevents foreign matter such as grit from entering the gap between the external spline portion 4 and the internal spline portion 7.

Both side surfaces 12A of each key 5 of the external spline portion 4 (referring to FIG. 2, reference numeral 12A is assigned to only both side surfaces of one key 5) function as driving power transmission surfaces. When each keyway 8 of the internal spline portion 7 meshes with the corresponding key 5, both side surfaces 13A opposed to the side surfaces 12A (referring to FIG. 2, reference numeral 13A is assigned to only both side surfaces of one keyway 8) function as driving power transmission surfaces. In other words, one side surface 12A of each key 5 and the side surface 13A of each keyway 8 corresponding to the side surface 12A come into contact with each other in rotation of the propeller shaft 12, to transmit power between the shafts 2 and 3.

Figure 3:
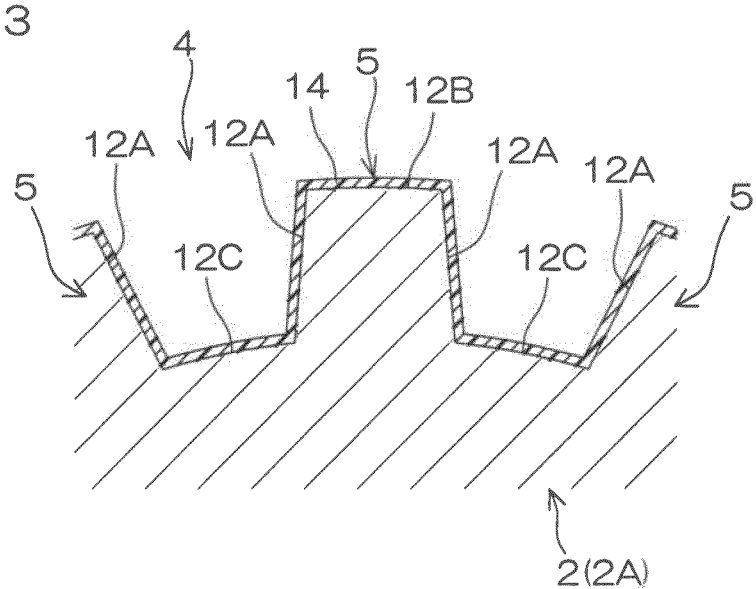
FIG. 3 is an enlarged sectional view showing an engaging state between an external spline portion and an internal spline portion shown in FIG. 2.

FIG. 3 is an enlarged sectional view of the external spline portion 4. The entire surface of the external spline portion 4 of the first shaft 2 (the surface of a base material 2A of the first shaft 2) is covered with a coat 14. More specifically, both side surfaces (power transmission surfaces) 12A and a top surface 12B of each key 5 and portions 12C of the outer peripheral surface of the first shaft 2 located between adjacent keys 5 are covered with the continuous coat 14.

Figure 4:
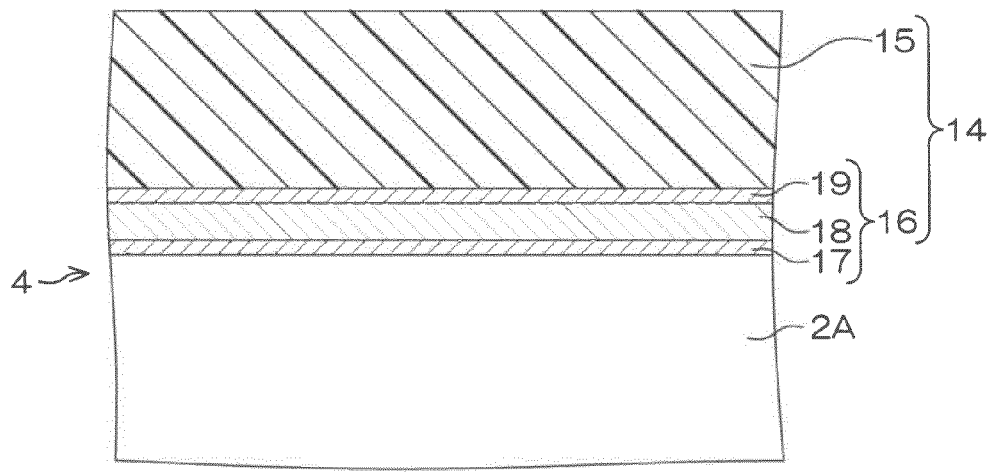
FIG. 4 is an enlarged sectional view of a coat shown in FIG. 3.

FIG. 4 is an enlarged sectional view of the coat 14 shown in FIG. 3.

The coat 14 includes a DLC (Diamond Like Carbon) film 15 covering the surface of the base material 2A of the first shaft 2 (the external spline portion 4) and an intermediate layer 16 interposed between the base material 2A and the DLC film 15.

More specifically, a first Cr layer 17 made of Cr (chromium) is formed on the surface of the base material 2A in the external spline portion 4. A CrN layer 18 made of CrN (chromium nitride) is formed on the surface of the first Cr layer 17. A second Cr layer 19 is formed between the CrN layer 18 and the DLC film 15. The first Cr layer 17, the CrN layer 18 and the second Cr layer 19 constitute the intermediate layer 16. In other words, the intermediate layer 16 has a multilayer structure obtained by stacking the first Cr layer 17, the CrN layer 18 and the second Cr layer 19 successively from the side closer to the base material 2A.

Slope compositions may be formed between the first Cr layer 17 and the CrN layer 18, between the CrN layer 18 and the second Cr layer 19 and between the second Cr layer 19 and the DLC film 15 respectively.

The first Cr layer 17 having strong bonding force to the base material 2A and the CrN layer 18 is interposed between the base material 2A and the CrN layer 18, whereby the CrN layer 18 exhibits excellent adhesiveness to the base material 2A. Further, the second Cr layer 19 having strong bonding force to the CrN layer 18 and the DLC film 15 is interposed between the CrN layer 18 and the DLC film 15, whereby the DLC film 15 exhibits excellent adhesiveness to the CrN layer 18. An Si slope layer may be further formed between the second Cr layer 19 and the DLC film 15. Therefore, the DLC film 15 has excellent adhesiveness to the base material 2A. Thus, the life of the first shaft 2 (the external spline portion 4) can be increased.

Further, Si (silicon) is added to the DLC film 15 in the ratio of 0 to 50 wt. %. In other words, the DLC film 15 is constituted of 100 to 50 wt. % of DLC and 0 to 50 wt. % of Si. While DLC itself exhibits excellent lubricity, the DLC film 15 has superior frictional properties (low frictional properties) due to the addition of Si.

The thickness of the DLC film 15 is 1.0 to 10.0 μm, for example. The thickness of the intermediate layer 16 is about 0.5 to 2.0 μm, for example. The thickness ratios between the first Cr layer 17, the Cr layer 18 and the second Cr layer 19 are about 1:4:1, for example.

The DLC film 15 has Knoop hardness HK of not less than 1000, and a friction coefficient of not more than 0.2.

The intermediate layer 16 includes the Cr layer 18 having high hardness (high wear resistance), and is hence hardly deformed. Therefore, the DLC film 15 is also hardly deformed, and the surface (a sliding surface) of the DLC film 15 sliding with the second shaft 3 (the internal spline portion 7) as a counter member can be kept planar. Thus, the frictional properties (low frictional properties) of the DLC film 15 are further improved. The coat 14 is prepared by a composite plasma apparatus 20.

Figure 5:
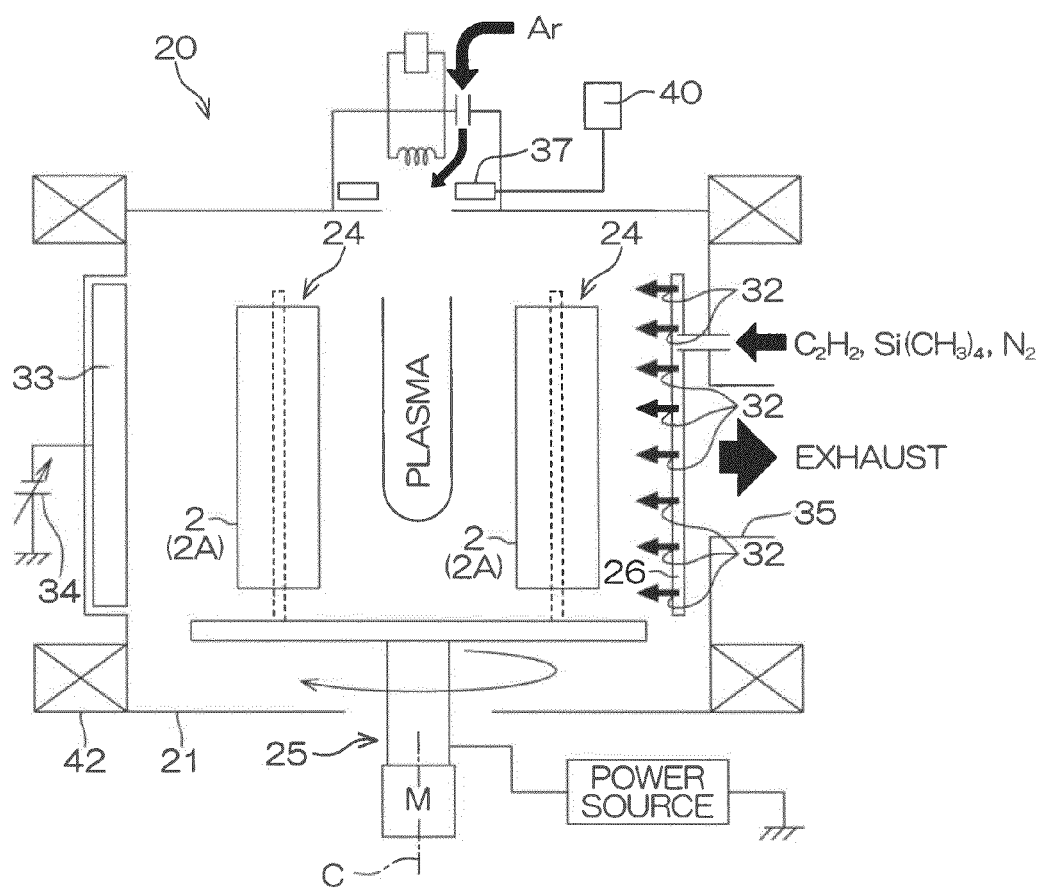
FIG. 5 is a schematic sectional view for illustrating the structure of an apparatus employed for preparing the coat.

FIG. 5 is a schematic sectional view for illustrating the structure of the apparatus 20 employed for preparing the coat 14.

The apparatus 20 is a batch type apparatus (a PIG type plasma CVD apparatus) for depositing the coat (a thin film) 14 on the surface of the base material 2A by plasma CVD (Plasma Chemical Vapor Deposition).

A deposition chamber 21 stores a plurality of (two in FIG. 5) rotation supporting portions 24 for supporting the first shaft 2 (the base material 2A) to be treated in a generally vertical attitude and rotating the first shaft 2 around the central axis thereof, a rotating mechanism 25 holding the rotation supporting portions 24 and rotating the base material 2A and the rotation supporting portions 24 around a prescribed rotation axis C extending in a generally vertical direction, and a source gas introduction tube 26 for introducing hydrocarbon-based gas (acetylene ($C_2H_2$), for example), silicon-based gas (tetramethylsilane ($Si(CH_3)_4$), for example: hereinafter abbreviated as "TMS") and nitrogen gas ($N_2$) into the deposition chamber 21 as source gas.

The source gas introduction tube 26 is a long tube closed on both ends, and extends on a side portion (outward in the radial direction) of the rotation supporting portions 24 in a generally vertical direction. A plurality of discharge holes 32 are formed on a portion of the source gas introduction tube 26 opposed to the rotation supporting portions 24. The discharge holes 32 are through-holes passing through the source gas introduction tube 26, and arranged along the longitudinal direction of the source gas introduction tube 26.

A Cr material 33 as a target for sputtering is arranged on a side portion (outward in the radial direction) of the rotation supporting portions 24 in the deposition chamber 21. A sputtering power source 34 is connected to the Cr material 33, to apply a voltage to the Cr material 33.

An exhaust duct 35 for exhausting the atmosphere from the deposition chamber 21 is connected to the deposition chamber 21. The exhaust duct 35 is connected to exhaust equipment in a factory. The exhaust equipment in the factory is regularly in operation, to regularly exhaust air through the exhaust duct 35.

A cathode 37 is made of molybdenum, for example, and provided in the form of a ring surrounding a region immediately under a negative electrode. A cathode power source 40 is connected to the cathode 37, to apply power to the cathode 37.

An auxiliary electromagnetic coil 42 surrounding the deposition chamber 21 is arranged on the periphery of the deposition chamber 21. An auxiliary coil magnetic field generating power source (not shown) is connected to the auxiliary electromagnetic coil 42.

A magnetic field in the deposition chamber 21 is controlled in response to the direction and the magnitude of a current flowing through the auxiliary electromagnetic coil 42, to adjust the shape of plasma generated in the deposition chamber 21. A film forming region with respect to the first shaft 2 is controlled due to the adjustment of the shape of the plasma.

A method of preparing the coat 14 is now described.

The first shaft 2 (the base material 2A) to be treated is introduced into the deposition chamber 21, and supported by the rotation supporting portions 24 in a state held in the generally vertical attitude. When the first shaft 2 is supported by the rotation supporting portions 24, rotation of the rotation mechanism 25 is started.

After starting of the rotation of the first shaft 2, the sputtering power source 34 is turned on, to apply the voltage to the Cr material 33 as the target of sputtering. Thus, the Cr material 33 is ionized, to float in the deposition chamber 21. Then, a Cr film is deposited on the surface of the first shaft 2 (the base material 2A). Thus, the first Cr layer 17 is formed on the surface of the base material 2A.

When a predetermined deposition time elapses after the sputtering power source 34 is turned on, a nitrogen gas valve (not shown) is opened, and the nitrogen gas is discharged from the discharge holes 32 of the source gas introduction tube 26 toward the surface of the base material 2A supported by the rotation supporting portions 24. Therefore, the deposition chamber 21 is filled with a nitrogen gas atmosphere. The Cr ions floating in the deposition chamber 21 react with the nitrogen gas to generate CrN, and a CrN film is deposited on the surface of the first Cr layer 17. Thus, the CrN layer 18 is formed on the surface of the first Cr layer 17.

When a predetermined deposition time elapses after the nitrogen gas valve is opened, the nitrogen gas valve is closed, to stop discharging the nitrogen gas from the discharge holes 32 of the source gas introduction tube 26. The ions of Cr float in the deposition chamber 21, and hence a Cr film is deposited on the surface of the CrN layer 18. Thus, the second Cr layer 19 is formed on the surface of the CrN layer 18.

When a predetermined deposition time (five minutes, for example) elapses after the nitrogen gas valve is closed, the sputtering power source 34 is turned off. Thus, the voltage application to the Cr material 33 is stopped.

Then, acetylene and TMS are discharged from the discharge holes 32 of the source gas introduction tube 26 toward the surface of the base material 2A supported by the rotation supporting portions 24, and the deposition chamber 21 is filled with an atmosphere of acetylene and TMS. Further, the cathode power source 40 and the auxiliary coil magnetic field generating power source are turned on.

Plasma is radiated in the deposition chamber 21, whereby acetylene and TMS in the deposition chamber 21 are plasmatized, and C ions, H ions and Si ions float in the deposition chamber 21. Then, the DLC film 15 is deposited on the surface of the base material 2A. Thus, the DLC film 15 is formed on the surface of the base material 2A.

When a predetermined deposition time (60 minutes, for example) elapses after the cathode power source 40 and the auxiliary coil magnetic field generating power source are turned on, the cathode power source 40 and the auxiliary coil magnetic field generating power source are turned off. Further, the discharge of acetylene and TMS from the discharge holes 32 of the source gas introduction tube 26 is stopped. In addition, the rotation of the rotation mechanism 25 is stopped.

Thus, the coat 14 including the DLC film 15 and the intermediate layer 16 is formed on the surface of the base material 2A of the first shaft 2.

The rotation mechanism 25 rotates the base material 2A around the rotation axis C during the serial treatment, whereby the films (the first Cr layer 17, the CrN layer 18, the second Cr layer 19 and the DLC film 15) can be uniformly deposited in the peripheral direction of the first shaft 2.

When only the portion of the first shaft 2 to be provided with the coat 14 is exposed and the remaining portion is covered with a mask of aluminum foil or the like in this embodiment, the coat 14 is not formed on the portion covered with the mask.

Example and comparative example are now described.

In each of Example and comparative example, a coat 14 was formed on the surface of a substrate (made of carbon steel) with the CVD apparatus shown in FIG. 5. The coat 14 includes a DLC film 15 covering the surface of the substrate and an intermediate layer 16 interposed between the surface of the substrate and the DLC film 15. The thickness of the DLC film 15 is 3 to 5 µm, and the thickness of the intermediate layer 16 is 0.5 to 1.5 µm.

The intermediate layer 16 according to Example has a multilayer structure obtained by stacking a first Cr layer 17, a CrN layer 18 and a second Cr layer 19 from the side closer to the substrate, as shown in FIG. 4. The thickness ratios between the first Cr layer 17, the CrN layer 18 and the second Cr layer 19 are 1:4:1.

In comparative example, a Ti film (a single film) having a thickness of 1 µm was employed as an intermediate layer 16.

A Rockwell indentation test was conducted on each of the substrate (the carbon steel substrate) provided with the coat 14 according to Example and the substrate provided with the coat according to comparative example. More specifically, a diamond indenter (made of diamond, having a radius of curvature of 0.2 mm on a forward end and a cone angle of 120°) was pressed against the substrate covered with the coat 14 with force of 1471N, to form an indentation on the coat 14. The indentation is a circular dent having a diameter of about 500 to 600 µm. The degree of separation of the coat 14 on the peripheral edge portion of the indentation was observed with an optical microscope, to evaluate adhesive force.

Figure 6:
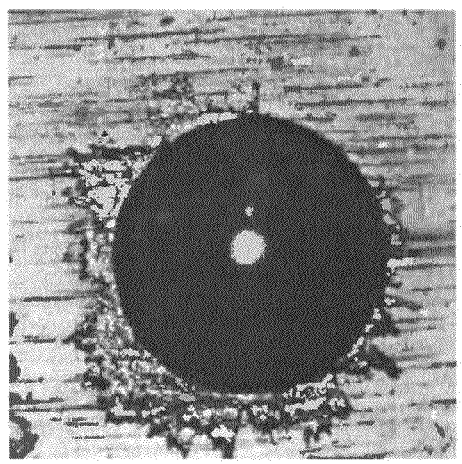
FIGS. 6(*a*) and 6(*b*) are image diagrams of optical micrographs of indentations showing results of a Rockwell indentation test.
Figure 6:
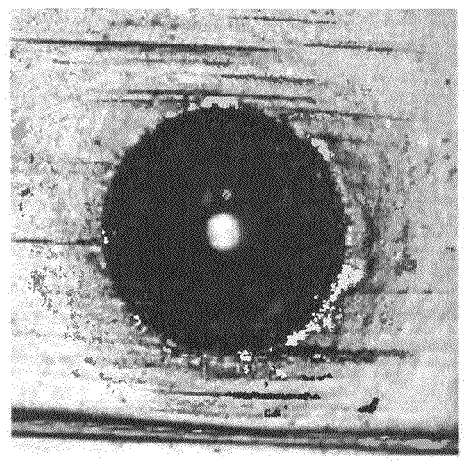

FIGS. 6(*a*) and 6(*b*) are image diagrams of optical micrographs of the indentations showing the results of the Rockwell indentation test. FIG. 6(*a*) shows the indentation in comparative example, and FIG. 6(*b*) shows the indentation in Example. While the coat 14 is hardly separated in the peripheral edge portion of the indentation in FIG. 6(*b*), the coat is remarkably separated and cracked in the peripheral edge portion of the indentation in FIG. 6(*a*). Thus, it is understood that the DLC film 15 has excellent adhesiveness to the base material 2A in Example.

Figure 7:
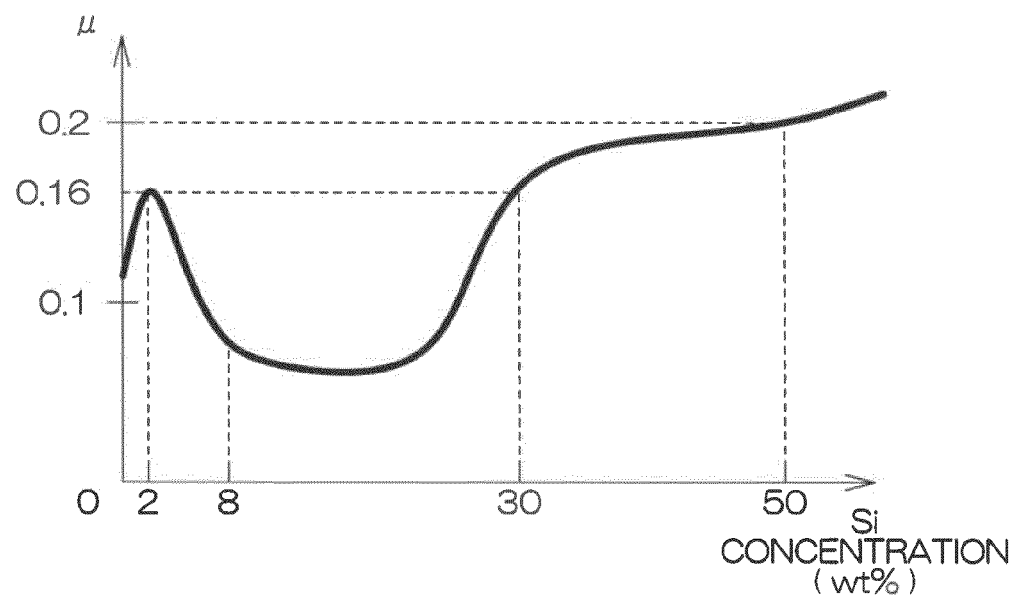
FIG. 7 is a graph showing the relation between an Si ratio in a DLC film and a frictional coefficient of the DLC film.

FIG. 7 is a graph showing the Si concentration in the DLC film 15 and the frictional coefficient of the DLC film 15.

It is understood from FIG. 7 that the DLC film 15 can exhibit excellent frictional properties (low frictional properties) when Si is added thereto in the ratio of 0 to 50 (wt. %).

While the embodiment of the present invention has been described, the present invention may be embodied in other ways.

While Si is added to the DLC film 15 in the aforementioned embodiment, Cr or Ti (titanium) may be added to the DLC film 15, in addition to Si. Alternatively, Cr or Ti may be added to the DLC film 15 in place of Si. Further alternatively, no organic metal such as Si may be added to the DLC film 15, but the DLC film 15 may be made of only DLC.

While the DLC film 15 and the intermediate layer 16 are formed in the common deposition chamber 21 in the aforementioned embodiment, the DLC film 15 and the intermediate layer 16 may alternatively be formed in deposition chambers different from each other.

While the coat 14 covers the surface of the external spline portion 4 in the aforementioned embodiment, the coat 14 may cover not the surface of the external spline portion 4, but the surface of the internal spline portion 7. Alternatively, the surfaces of both of the external spline portion 4 and the internal spline portion 7 may be covered with coats 14. When arranged on the surface of the internal spline portion 7, the coat 14 continuously covers the overall region of the surface of the internal spline portion 7, i.e., both side surfaces 13A (power transmission surfaces) and a bottom surface of each keyway 8 and portions of the inner peripheral surface of the second shaft 3 located between adjacent keyways 8.

While coats 14 can be partially provided only on the side surfaces 12A of the keys 5 and/or the side surfaces 13A of the keyways 8 (i.e., only on the power transmission surfaces), productivity is reduced due to an additional step of masking or the like and the partially formed coats 14 easily separate from edge portions thereof in this case. In consideration of such disadvantages, the coat 14 preferably covers the overall region of the external spline portion 4 and/or the internal spline portion 7.

While the coat 14 is arranged on the surface of the external spline portion 4 and/or the internal spline portion of the propeller shaft (the drive shaft) in the above description, the coat 14 can alternatively be arranged on a tooth flank of a worm of a steering apparatus, a raceway surface of an inner or outer ring and/or a cage of a bearing, or the surface of a clutch plate of a friction clutch.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2009-34575 filed with the Japan Patent Office on Feb. 17, 2009, the disclosure of which is incorporated herein by reference.

What is claimed is:

1. A sliding member having a base material whose surface is at least partially covered with a diamond like carbon (DLC) film, wherein
an intermediate layer is interposed between the base material and the DLC film,
the intermediate layer has a multilayer structure obtained by stacking a first Cr layer, a CrN layer and a second Cr layer successively from a side closer to the base material, and
the DLC film covers the second Cr layer,
wherein the thickness of the DLC film is 3 to 5 µm.

2. The sliding member according to claim 1, wherein Si is added to the DLC film in the ratio of 0 to 50 wt. %.

3. The sliding member according to claim 1, wherein the DLC film has a multilayer structure obtained by stacking Si slope layers.

4. The sliding member according to claim 1, wherein the sliding member is a spline portion of a propeller shaft.

5. The sliding member according to claim 1, wherein the thickness ratio between the first Cr layer, the CrN layer and the second Cr layer is 1:4:1.

6. The sliding member according to claim 1, wherein the thickness of the intermediate layer is about 0.5 to 2.0 µm.

7. The sliding member according to claim 1, wherein the thickness of the intermediate layer is about 0.5 to 1.5 µm.

8. The sliding member according to claim 1, wherein the base material is made of carbon steel.

9. The sliding member according to claim 1, wherein the thickness ratio between the first Cr layer and the CrN layer is 1:4.

10. The sliding member according to claim 1, wherein the thickness ratio between the CrN layer and second Cr layer is 4:1.

11. A sliding member having a base material whose surface is at least partially covered with a diamond like carbon (DLC) film, wherein
an intermediate layer is interposed between the base material and the DLC film,
the intermediate layer has a multilayer structure obtained by stacking a first Cr layer, a CrN layer and a second Cr layer successively from a side closer to the base material, and the DLC film covers the second Cr layer, wherein the thickness of the intermediate layer is about 0.5 to 2.0 μm.

12. The sliding member according to claim 11, wherein Si is added to the DLC film in the ratio of 0 to 50 wt.%.

13. The sliding member according to claim 11, wherein the DLC film has a multilayer structure obtained by stacking Si slope layers.

14. The sliding member according to claim 11, wherein the sliding member is a spline portion of a propeller shaft.

15. The sliding member according to claim 11, wherein the thickness ratio between the first Cr layer, the CrN layer and the second Cr layer is 1:4:1.

16. The sliding member according to claim 11, wherein the thickness of the DLC film is 1.0 to 10.0 μm.

17. The sliding member according to claim 11, wherein the thickness of the intermediate layer is about 0.5 to 1.5 μm.

18. The sliding member according to claim 11, wherein the base material is made of carbon steel.

19. The sliding member according to claim 11, wherein the thickness ratio between the first Cr layer and the CrN layer is 1:4.

20. The sliding member according to claim 11, wherein the thickness ratio between the CrN layer and second Cr layer is 4:1.

* * * * *